United States Patent [19]

Kawasaki

[11] Patent Number: 5,471,484
[45] Date of Patent: Nov. 28, 1995

[54] METHOD AND APPARATUS FOR TESTING DIGITAL SIGNALS

[75] Inventor: Soichi Kawasaki, Tokyo, Japan

[73] Assignee: Kabushiki Kaisha Toshiba, Kawasaki, Japan

[21] Appl. No.: 854,897

[22] Filed: Mar. 20, 1992

[30] Foreign Application Priority Data

Mar. 20, 1991 [JP] Japan ..................... 3-57028

[51] Int. Cl.$^6$ ................... G01R 31/28; G06F 11/00
[52] U.S. Cl. ................ 371/25.1; 371/6; 371/67.1; 371/57.2
[58] Field of Search ............... 371/71, 24, 25.1, 371/68.1, 48, 67.1, 22.6, 22.3, 22.1, 11, 73, 25.1, 6

[56] References Cited

U.S. PATENT DOCUMENTS

| | | | |
|---|---|---|---|
| 3,824,558 | 7/1974 | Koshiba | 340/172.3 |
| 4,122,995 | 10/1978 | Franke | 371/73.1 |
| 4,146,835 | 3/1979 | Chnapko | 371/73.1 |
| 4,638,246 | 1/1987 | Blank | 371/73.1 |
| 4,718,065 | 1/1988 | Boyle | 371/25 |
| 4,837,765 | 6/1989 | Suzuki | 371/25 |
| 5,052,021 | 9/1991 | Goto | 375/76 |
| 5,166,937 | 11/1992 | Blecha | 371/22.5 |
| 5,170,398 | 12/1992 | Fujieda | 371/27 |
| 5,175,447 | 12/1992 | Kawasaki | 307/480 |
| 5,220,585 | 6/1993 | Sasaki | 375/106 |

FOREIGN PATENT DOCUMENTS 0159665  8/1985  Japan ..................... 371/24

OTHER PUBLICATIONS

IBM Technical Disclosure Bulletin vol. 24 No. 7A Dec. 1981.
IBM Technical Disclosure Bulletin vol. 13 No. 5 Oct. 1970.

Primary Examiner—Robert W. Beausoliel, Jr.
Assistant Examiner—Ly V. Hua
Attorney, Agent, or Firm—Oblon, Spivak, McClelland, Maier & Neustadt

[57] ABSTRACT

A logical circuit is tested by comparing at least one arbitrary bit of a logical signal among logical signals outputted from the logical circuit with an expected value corresponding to the correct level of the logical signal, and comparing a bit position at which the level of the logical signal changes with an expected change point indicating a bit position at which the level of the correct logical signal changes. Such a test can be performed using a tester having a first comparator for comparing a logical signal outputted from a logical circuit to be tested with an expected value corresponding to the correct level of the logical signal, during at least one arbitrary unit test cycle, a change point detecting unit for detecting a time of level change of the logical signal and outputting change point information, by comparing the logical signal delayed by the unit test cycle with the logical signal not delayed, an expected change point generator for generating an expected change point signal indicating a bit position at which the level of the correct logical signal changes, and a second comparator for comparing the change point information with the expected change point signal, wherein the logical circuit is tested using the comparison results of the first and second comparators.

7 Claims, 5 Drawing Sheets

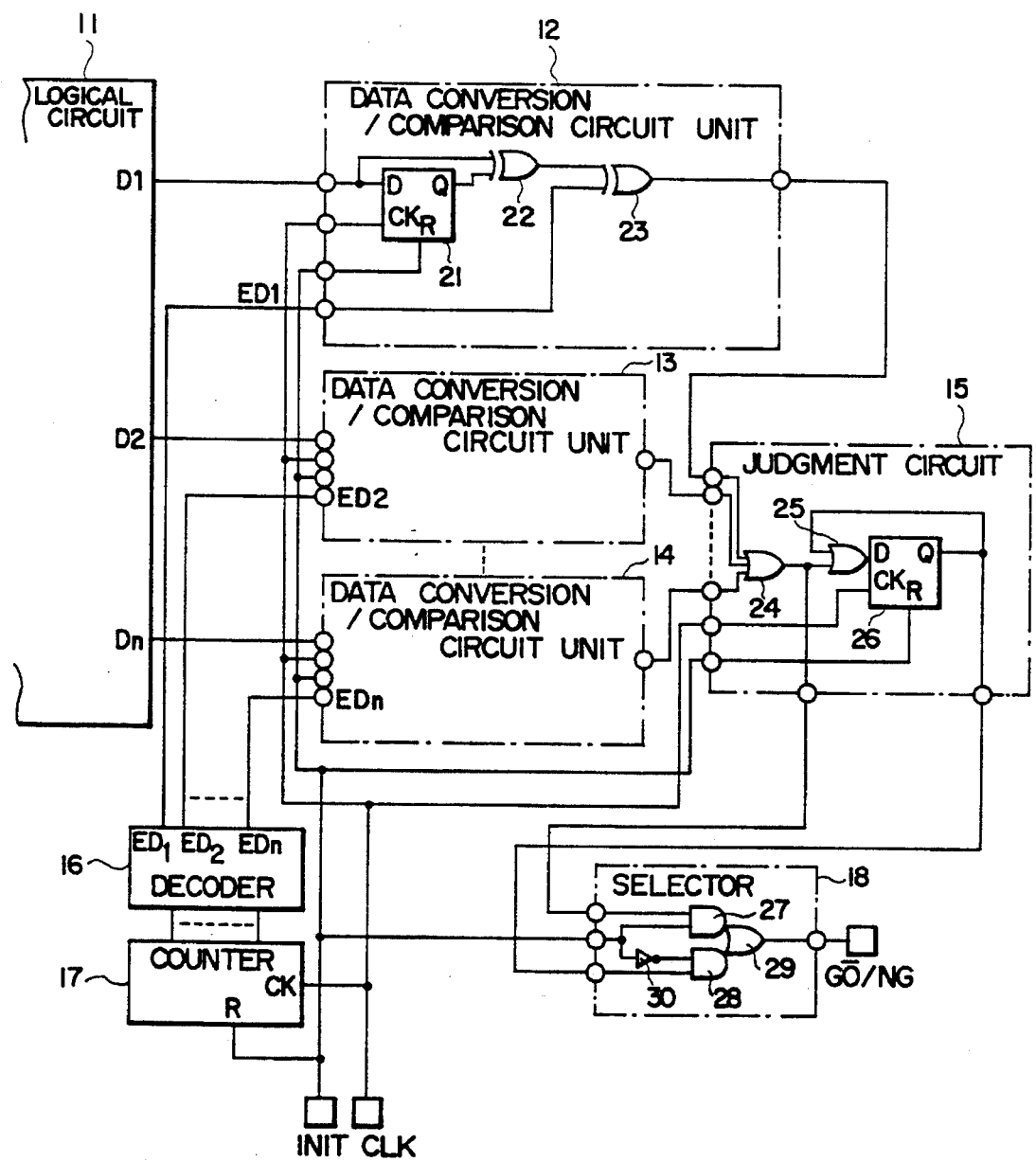
F I G. 1

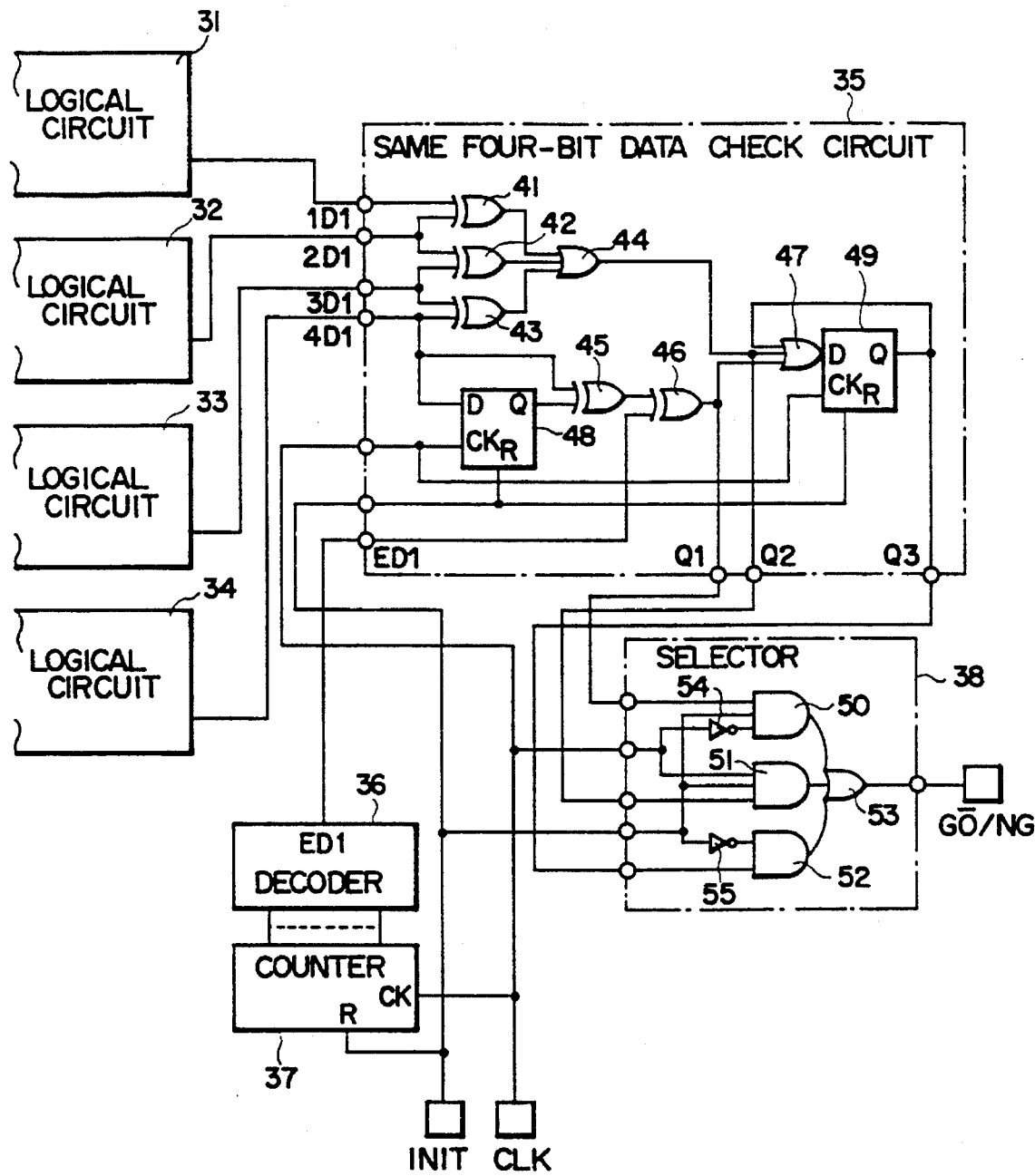
F I G . 3

5,471,484

METHOD AND APPARATUS FOR TESTING DIGITAL SIGNALS

BACKGROUND OF THE INVENTION

The present invention relates to a method of testing a logical circuit function and a logical circuit tester.

A conventional tester for testing logical signals (binary digits assuming the values of "0" or "1") outputted from a logical circuit has a structure such as shown in FIG. 5. An integrated logical circuit device 1 has therein a logical circuit 2. n logical signals outputted from n output terminals OUT1 to OUTn of the logical circuit 2 are subject to testing.

The output terminals OUT1 to OUTn of the logical circuit 2 are connected to input terminals IN1 to INn of n comparator circuits 4 to 6. Each of the n comparator circuits 4 to 6 has three input terminals. The other two terminals are connected to the output terminals of an expected value signal generator 7 and a timing signal generator 8. An input terminal of the expected value signal generator 7 is connected to an output terminal of the timing signal generator 8.

The output terminals of the comparator circuits 4 to 6 are connected to input terminals of a judgment circuit 9. One input terminal of the judgment circuit 9 is connected to an output terminal of the timing signal generator 8. An output terminal of the judgment circuit 9 is connected to an output terminal GO/NG of the tester 3.

N logical signals outputted from the logical circuit 2 are supplied to the comparator circuits 4 to 6. These logical signals are outputted when a testing signal is inputted thereto at a test timing. The timing signal generator 8 supplies a signal determining the test timing to the expected value signal generator 7 which in turn outputs n expected value signals. These expected value signals correspond to correct logical signal outputs from the logical circuit 2 for a given set of inputs. The expected value signals are inputted to the comparator circuits 4 to 6 and are compared with the logical signals. The comparison results are outputted to the judgment circuit 9. If the comparison results for all n pairs indicate coincidence, the logical circuit 2 is judged as normal. If any one of the comparison results for all n pairs does not indicate coincidence, the logical circuit 2 is judged as abnormal. These judgment results are outputted from the output terminal GO/NG of the tester 3. It is necessary for the expected value generator 7 to store data for generating expected values, so the generator 7 generally has a storage function. As recent function tests become more and more complex, it is desirable that the expected value generator 7 also includes a testing function. It is therefore desired the expected value generator 7 include the tester 3 therein.

Conventionally, all logical values are compared with corresponding expected values. Therefore, it is difficult for the expected value generator 7 to include the tester 3 on a single integrated logical circuit device, because of the large capacity of storage and size of circuits.

SUMMARY OF THE INVENTION

The present invention has been made in consideration of the above circumstances. It is an object of the present invention to provide a logical signal testing method and a testing circuit, capable of being implemented on an integrated circuit device of a logical circuit, while maintaining a testing precision substantially the same as conventional and making compact the testing circuit.

According to a method of testing a logical signal of the present invention, at least one bit of an arbitrary logical signal among logical signals outputted from a logical circuit to be tested, is compared with an expected value corresponding to the correct level of the logical signal, and a bit position at which the level of the logical signal changes, is compared with an expected change point indicating a bit position at which the level of the correct logical signal changes, to thereby test the logical circuit.

By comparing at least one bit of an arbitrary logical signal among logical signals outputted from a logical circuit to be tested, with an expected value corresponding to the correct level of the logical signal, the bit can be tested for whether it is normal. By comparing the bit position at which the level of the logical signal changes, with the expected change point, all logical signals can be tested for whether they are normal. The information necessary to be stored is only one bit logical signals and expected change points indicating the bit positions at which the logical signals change. Therefore, the capacity of storage is considerably small when compared with the case where all expected values are required to be stored.

Such a testing method can be performed by using a tester of the present invention. The tester comprises: first comparison means for comparing a logical signal outputted from a logical circuit to be tested, with an expected value corresponding to the correct level of the logical signal, during at least one arbitrary unit test cycle; change point detecting means for detecting a time of level change of the logical signal and outputting a change point information, by comparing the logical signal delayed by the unit test cycle with the logical signal not delayed; expected change point generating means for generating an expected change point signal indicating a bit position at which the level of the correct logical signal changes; and second comparison means for comparing the change point information signal with the expected change point signal, wherein the logical circuit is tested using the comparison results by the first and second comparison means.

The first comparison means compares a logical signal with an expected value during at least one arbitrary unit test cycle. The change point detecting means detects, from the comparison results between the logical signal delayed by the unit test cycle with the logical signal not delayed, no level change when the comparison results indicate coincidence and a level change when the results do not indicate coincidence, and outputs the change point information. The expected change point generating means generates an expected change point signal indicating a bit position at which the level of the correct logical signal changes. The second comparison means compares the change point information signal with the expected change point signal. If the comparison results by the first and second comparison means both indicate coincidence, the logical signal is judged as normal.

The tester of the present invention may be a tester for testing a single or a plurality of logical circuits expected to output a plurality of same logical signals, comprising: first comparison means for comparing one arbitrary logical signal (first logical signal) among the plurality of logical signals with an expected value corresponding to the correct level of the logical signal, during at least one arbitrary unit test cycle; change point detecting means for detecting a time of level change of the first logical signal and outputting a change point information, by comparing the first logical signal delayed by the unit test cycle with the first logical signal not delayed; expected change point generating means for generating an expected change point signal indicating a bit position at which the level of the correct logical signal changes; second comparison means for comparing the change point information signal with the expected change point signal; and third comparison means for comparing all the plurality of logical signals, wherein the logical circuits are tested using the comparison results by the first, second, and third comparison means.

For such a case wherein logical circuits are expected to output a plurality of same logical signals, one arbitrary logical signal, first logical signal, is tested by the first comparison means, change point detecting means, and second comparison means, to thereby judge whether the first logical signal is normal. The third comparison means compares all the logical signals as to their coincidence, to thereby test whether all the logical signals are normal.

BRIEF DESCRIPTION OF THE DRAWINGS

In the accompanying drawings:

FIG. 1 is a block diagram showing the structure of a tester according to a first embodiment of the present invention;

FIG. 3 is a block diagram showing the structure of a tester according to a second embodiment of the present invention;

DESCRIPTION OF THE PREFERRED EMBODIMENTS

Figure 2:
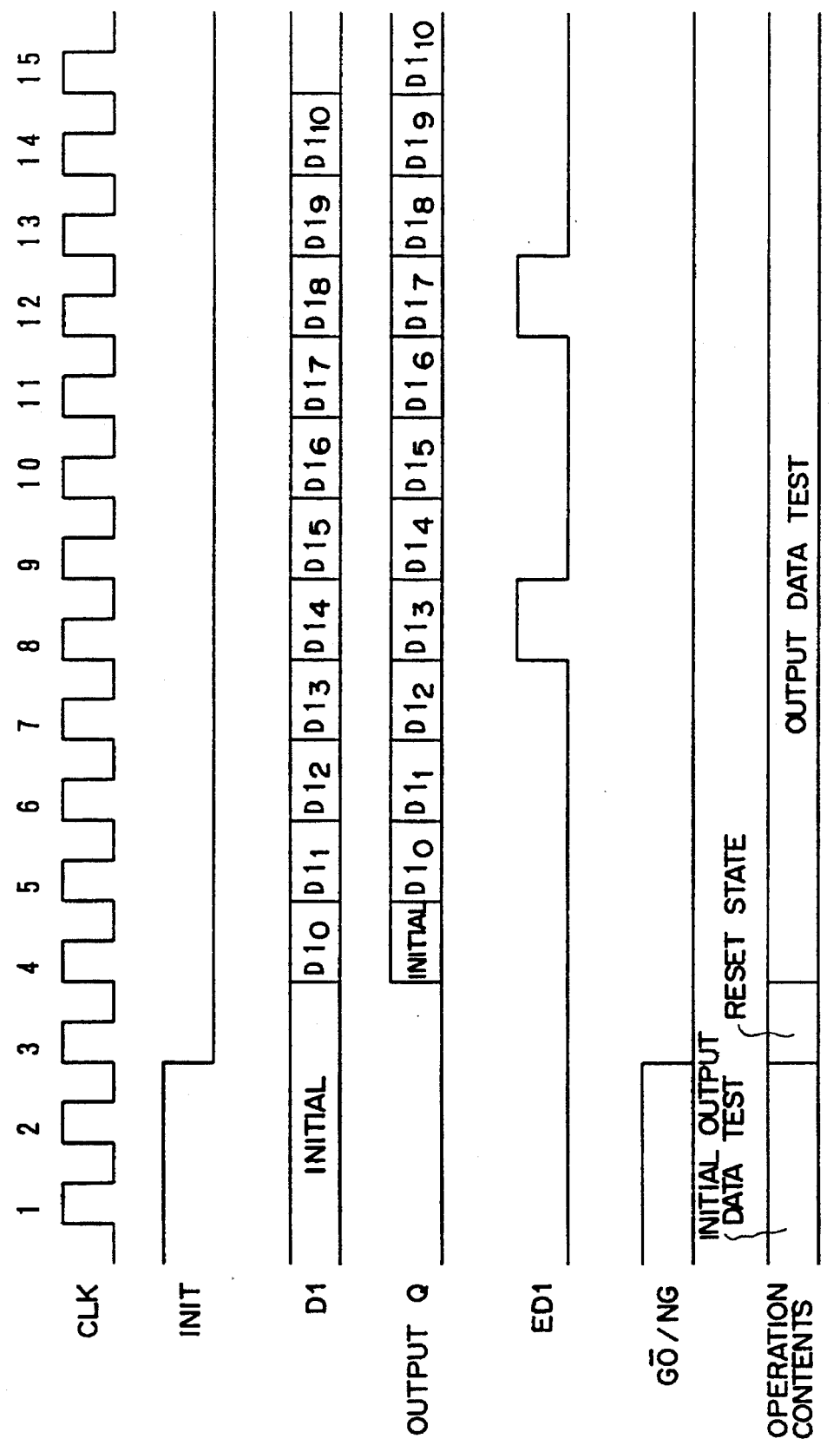
FIG. 2 is a timing chart showing signal waveforms of the tester.

Embodiments of the present invention will be described with reference to the accompanying drawings. FIG. 1 shows a logical circuit 11 to be tested, and the structure of a tester of the first embodiment. The tester is constructed of n data conversion/comparison circuit units 12 to 14, a judgment circuit 15, a decoder 16, a counter 17, and a selector 18.

Each data conversion/comparison circuit unit 12 to 14 has four input terminals. One of the four input terminals is connected to a corresponding one of output terminals D1 to Dn of the logical circuit 11. Two of the four input terminals are connected to a corresponding one of output terminals ED1 to EDn (n is an integer 1 or larger) and to a clock terminal CLK to which an external clock pulse CLK is inputted. Each data conversion/comparison circuit unit 12 to 14 has a D-type flip-flop 21, and EX-OR gates 22 and 23. A data terminal D of the D-type flip-flop 21 is connected to the output terminal D1 of the logical circuit 11, a clock terminal CK thereof is connected to the clock terminal CLK, and a reset terminal R thereof is connected to an initialization terminal INIT to which an external initializing signal is inputted. Input terminals of the EX-OR gate 22 are connected to the output terminal D1 and non-inverting output terminal Q of the D-type flip-flop 21, and input terminals of the EX-OR gate 23 are connected to an output terminal of the EX-OR circuit 22 and the output terminal ED1 of the decoder 16. An output terminal of the EX-OR gate 23 is connected to an output terminal of the data conversion/ comparison circuit unit 12.

The output terminal of each data conversion/comparison circuit unit 12 to 14 is connected to an input terminal of the judgment circuit 15. Two input terminals of the judgment circuit judgment circuit 15 are connected to the clock terminal CLK and the initialization terminal INIT. The judgment circuit 15 has OR gates 24 and 25 and a D-type flip-flop 26. Input terminals of the OR gate 24 are connected to the n output terminals of the data conversion/comparison circuit units 12 to 14. An output terminal of the OR gate 24 is connected to one input terminal of the OR gate 25 and to one input terminal of the selector 18. An output terminal of the OR gate is connected to a data terminal D of the D-type flip-flop 26. A clock terminal CK of the D-type flip-flop 26 is connected to the clock terminal CLK, and the reset terminal R thereof is connected to the initialization terminal INIT. An output terminal Q of the D-type flip-flop 26 is connected to the other input terminal of the OR gate 25 and to the other input terminal of the selector 18.

The selector 18 has AND gates 27 and 28, an OR gate 29, and an inverter 30. One of three input terminals of the selector 18 is connected, as described previously, to the output terminal of the OR gate 24. This one input terminal is connected to one input terminal of the AND gate 27. One input terminal of the selector 18 is connected to the initialization terminal INIT, this input terminal being connected to the other input terminal of the AND gate 27. One input terminal of the AND gate 28 is connected via the inverter 30 to the initialization terminal INIT, and the other input terminal of the AND gate 28 is connected to a non-inverting terminal Q of the D-type flip-flop 26. Output terminals of the AND gates 27 and 28 are connected to input terminals of the OR gate 29, and an output terminal of the OR gate 29 is connected to an output terminal GO/NG of the selector 18.

A reset terminal of the counter 17 is connected to the initialization terminal INIT, and its clock terminal is connected to the clock terminal CLK. The counter 17 has m (m is an integer 1 or larger) output terminals which are connected in parallel to m input terminals of the decoder 16.

The logical circuit 11 is tested in the following manner, using the tester of the first embodiment constructed as above. Logical signals are outputted from the output terminals D1 to Dn of the logical circuit 11 to the data conversion/ comparison circuit units 12 to 14. Consider for example the data conversion/comparison circuit unit 12. A logical signal D1 is inputted to the data terminal D of the D-type flip-flop 21. An external clock pulse CLK is inputted to the clock terminal CK. This clock pulse CLK changes to level "1" at the test timing. The D-type flip-flop 21 latches the logical signal D1 at the timing when the clock pulse CLK takes level "1". At this time, the D-type flip-flop outputs a logical signal D1 at one cycle before this latch. The logical signal D1 one cycle before and the present logical signal D1 are inputted to the EX-OR gate 22. If both the logical signals D1 are the same, a "0" level signal is outputted, and if not, a "1" level signal is outputted. Namely, when the level of the logical signal D1 changes, this change point is detected. This change point detection signal is inputted to the EX-OR gate 23.

The EX-OR gate 23 is also inputted with an expected change point signal outputted from the decoder 16. Expected change point signals ED1 to EDn are generated in the following manner. The counter 17 counts up at a predetermined timing when each logical signal D1 to Dn is outputted. The count is supplied to a decoder 16. The decoder 16 outputs the expected change point signals ED1 to EDn of level "0" in an ordinary case. When the count takes a value at which each logical signal D1 to Dn is to be changed, it outputs the expected change point signals ED1 to EDn of level "1".

The expected change point signal ED1 and change point detection signal are inputted to the EX-OR gate 23 to compare them for whether both the signals are the same, i.e., whether the logical signal has changed at the correct time. If both the signals are the same, a "0" level signal indicating a normal state is outputted. On the contrary, if both the signals are different, a "1" level signal indicating an abnormal state is outputted. Similarly, in the other data conversion/comparison circuit units 13 to 14, the logical signals D2 to Dn are compared with the expected change point signals ED2 to EDn to output the comparison results.

All of these comparison results are inputted to the OR gate 24 of the judgment circuit 15. The OR gate 24 outputs a "0" level signal if all the comparison results indicate a normal state, and a "1" level signal if any one of the comparison results indicates an abnormal state. An output of the OR gate 24 is supplied to the OR gate 25 and selector 18. The OR gate 25 is inputted with an output from the OR gate 24 and a non-inverting output Q from the D-type flip-flop 26. The D-type flip-flop 26 latches an output of the OR gate 25 at the test timing determined by the clock pulse CLK. A latched output is inputted to the OR gate 25. Therefore, if an abnormal state is detected at anytime, the OR gate 24 outputs a "1" level signal and then the D-type flip-flop 26 outputs a non-inverted "1" level output Q. Two types of comparison results can thus be obtained. Namely, an output of the OR gate 24 indicates whether the logical signals D1 to Dn at each bit position are normal or not, and the non-inverted output of the D-type flip-flop 26 indicates whether an abnormal state, if any, has occurred in the past.

The selector 18 is supplied with an output from the OR gate 24 of the judgment circuit 15 and a non-inverting output Q of the D-type flip-flop 26. One of the outputs is selected by the initializing signal INIT. When the initializing signal INIT takes a "1" level, an output of the OR gate 24 is selected and outputted from the output terminal GO/NG. When the initializing signal INIT takes a "0" level, an output of the D-type flip-flop 26 is selected and outputted.

FIG. 2 shows signal waveforms of the tester. First, the initializing signal INIT takes a "1" level which is inputted to the reset terminals R of the counter 17, of the D-type flip-flops 21 of the data conversion/comparison circuit units 12 to 14, and of the D-type flip-flop 26 of the judgment circuit 15, to initialize them. During this period, the expected change point signals ED1 to EDn are set to "0" level. As a result, the logical signals D1 to Dn per se are outputted from the output terminal of each data conversion/comparison circuit unit 12 to 14.

If the logical signals D1 to Dn are tested only as to whether they change at their change points, a normal state is judged even if all levels of each logical signal are inverted. Therefore, for example, in the case of the logical signal D1, it is necessary to check whether the level of at least one of logical signals D10, D11, D12, D13, . . . is correct or not. Such check can be executed in the following manner. The selector 18 selects an output of the OR gate 24 of the judgment circuit 15 and outputs it from the output terminal GO/NG while the initializing signal INIT takes a "1" level. In this condition, of the logical signals D1 to Dn outputted from the logical circuit 11, the levels of the logical signal D1 alone take meaningful levels while making the other logical signals take a "0" level. Next, the levels of the logical signal D2 alone take meaningful levels. In this manner, the levels of each logical signal D1 to Dn are outputted to check whether the levels of initial values of each logical signal are correct or not.

After the initial value check, the initializing signal INIT is changed to a "0" level when the third clock pulse CLK rises. The selector 18 then selects and outputs a non-inverting output Q of the D-type flip-flop 26.

When the fourth clock pulse CLK rises, a logical signal test starts. At this timing, the D-type flip-flop 21 outputs from the non-inverting terminal Q a logical signal D1 latched when initialized. When the fifth clock pulse CLK rises, the D-type flip-flop 21 outputs from the non-inverting terminal Q a first latched logical signal D10. The EX-OR gate 22 is inputted with the logical signal D10 at the preceding cycle and the logical signal D11 at the present cycle, which are compared with each other. In this manner, a change in the logical signals D11, D12, D13, D14, . . . is checked. In this timing chart, the expected change point signal ED1 indicates that the logical signals D14 and D18 change at the eighth and twelfth clock pulses CLKs. The comparison results at the data conversion/comparison circuit units 12 to 14 are inputted to the judgment circuit 15. During the logical signal test, the non-inverting output Q of the D-type flip-flop 26 is selected and outputted from the output terminal GO/NG as the final judgment result.

In this embodiment, the initial values of each logical signal D1 to Dn are checked. Instead of the initial values, other values of each logical signal of desired time may be checked. Also in this embodiment, the comparison results between logical signals and expected change point signals are outputted in real time from the selector 18. The comparison results are not necessarily required to be outputted in real time, but they may be outputted after completion of all tests for example.

Furthermore, an additional circuit may be provided for testing an optional logical signal by comparing it with expected values and monitoring the test results.

A tester of the second embodiment according to the present invention is shown in FIG. 3. The second embodiment is applied to a plurality of logical circuits 31 to 34 each outputting the same logical signal. Output terminals 1D1 to 4D1 of the logical circuits 31 to 34 are connected to input terminals of a same four-bit data check circuit 35. Connected to other input terminals of the same four-bit data check circuit 35 are an output terminal of a decoder 36, an initialization terminal INIT, and a clock terminal CLK.

The same four-bit data check circuit 35 has five EX-OR gates 41 to 43, 45 and 46, OR gates 44 and 47, and D-type flip-flops 48 and 49. One input terminal of the EX-OR gate 41 is connected to an output terminal 1D1 of the logical circuit 31, and another input terminal thereof and one input terminal of the EX-OR gate 42 are connected to an output terminal 2D1 of the logical circuit 32. Another input terminal of the EX-OR gate 42 and one input terminal of the EX-OR gate 43 are connected to an output terminal 3D1 of the logical circuit 33. Another input terminal of the EX-OR gate 43 is connected to an output terminal 4D1 of the logical circuit 34. The output terminal 4D1 of the logical circuit 34 is also connected to one input terminal of the EX-OR gate 45 and to a data terminal D of the D-type flip-flop 48. A non-inverting output terminal Q of the D-type flip-flop 48 is connected to another input terminal of the EX-OR gate 45. Clock terminals CK of the D-type flip-flops 48 and 49 are connected to the clock terminal CLK, and a reset terminal R thereof is connected to the initialization terminal INIT.

Output terminals of the EX-OR gates 41 to 43 are connected to input terminals of the OR gate 44 whose output terminal is connected to an input terminal of the OR gate 47. An output terminal of the EX-OR gate 45 is connected to one input terminal of the EX-OR gate 46, another input terminal of which is connected to an output terminal ED1 of the decoder 36. An output terminal of the EX-OR gate 46 is connected to an input terminal of the OR gate 47. An output terminal of the OR gate 47 is connected to a data terminal of the D-type flip-flop 49. A non-inverting output terminal Q thereof is connected to an input terminal of the OR gate 47. The non-inverting output terminal Q of the D-type flip-flop 49 is also connected to an output terminal Q3 of the same four-bit data check circuit 35. An output terminal of the OR gate 44 is connected to an output terminal Q2, and an output terminal of the EX-OR gate 46 is connected to an output terminal Q1.

Input terminals of a selector 38 are connected to the output terminals Q1 to Q3 of the same four-bit data check circuit 35, clock terminal CLK, and initialization terminal INIT. The selector 38 has inverters 54 and 55, AND gates 50 to 52, and an OR gate 53. The output terminal Q1 is connected to an input terminal of the AND gate 50, the output terminal Q2 is connected to an input terminal of the AND gate 51, and the output terminal Q3 is connected to an input terminal of the AND gate 52. Another input terminal of the AND gate 50 is connected via the inverter 54 to the clock terminal CLK, and another input terminal of the AND gate 51 is directly connected to the clock terminal CLK. Other input terminals of the AND gates 50 and 51 are directly connected to the initialization terminal INIT, and another input terminal of the AND gate 52 is connected via the inverter 55 to the initialization terminal INIT. Output terminals of the AND gates 50 to 52 are connected to input terminals of the OR gate 53, and an output terminal of the OR gate 53 is connected to an output terminal GO/NG of the selector 38.

The logical circuits 31 to 34 are tested in the following manner, using the tester of the second embodiment constructed as above. The logical circuits 31 to 34 output same logical signals 1D1 to 4D1 to the EX-OR gates 41 to 43 of the same four-bit data check circuit 35. The logical signals 1D1 and 2D1, 2D1 and 3D1, and 3D1 and 4D1 are respectively compared with each other. If the logical signals are the same, a "0" level signal is outputted to the OR gate 44. If any one of the logical signal groups is different, the OR gate 44 outputs a "1" level signal to the OR gate 47. In the above manner using the EX-OR gates 41 to 43 and OR gate 44, the four logical signals 1D1 to 4D1 are checked whether they are the same.

A change point of one of the four logical signals, logical signal 4D1, is detected. The circuit arrangement of the D-type flip-flop 48 inputted with the logical signal 4D1 and EX-OR gates 45 and 46 is the same as the data conversion/comparison circuit unit 12 shown in FIG. 1. A change point detection signal for the logical signal 4D1 is inputted to the EX-OR gate 46. If this signal is the same as an expected change point signal ED1 outputted from the decoder 36, a "0" level signal is outputted to the OR gate 47, and if different, a "1" level signal is outputted to the OR gate 47.

The OR gate 47 outputs a "0" level signal if all the logical signals 1D1 and 4D1 are the same and the expected change point signal ED1 and logical signal 4D1 are the same, and a "1" level signal in the other case. This output of the OR gate 47 is latched by the D-type flip-flop 49 at the test timing. If there is any abnormal state, a "1" level signal is outputted from the non-inverting terminal Q of the D-type flip-flop 49.

A signal from the EX-OR gate 46 is outputted from the output terminal Q1 of the same four-bit data check circuit 35, a signal from the OR gate 44 is outputted from the output terminal Q2, and a signal from the D-type flip-flop 49 is outputted from the output terminal Q3. These signals are inputted to the selector 38 which selects one of them in accordance with a combination of the initialization signal INIT and clock pulse CLK, and outputs it to the output terminal GO/NG. A signal at the output terminal Q3 is selected when the initializing signal INIT takes "0" level, and a signal at the output terminal Q2 is selected when the initializing signal INIT and clock pulse CLK both take "1" level. A signal at the output terminal Q1 is selected when the initializing signal INIT takes "1" level and the clock pulse CLK take "0" level.

Figure 4:
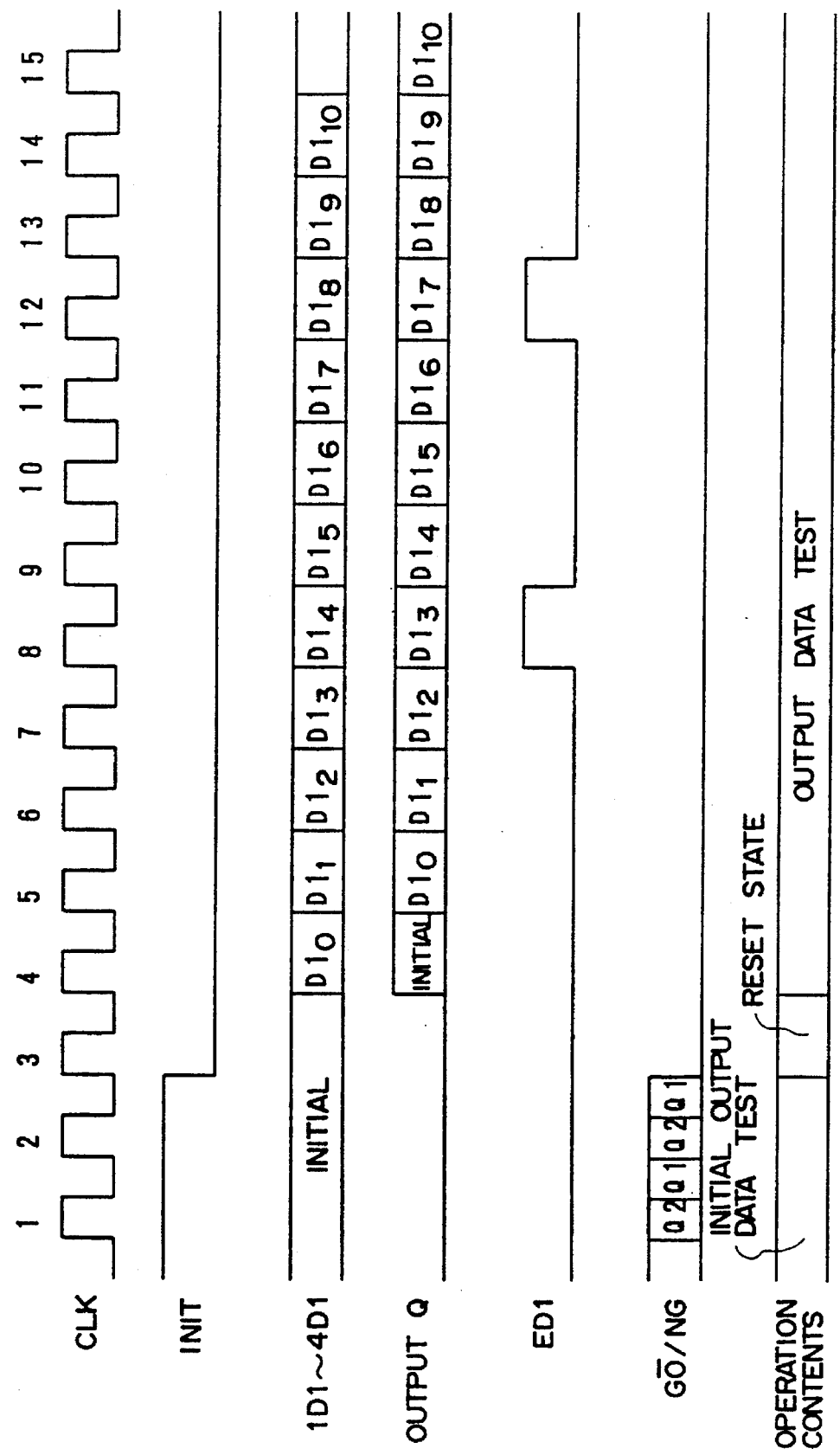
FIG. 4 is a timing chart showing signal waveforms of the tester shown in FIG. 3.
Figure 5:
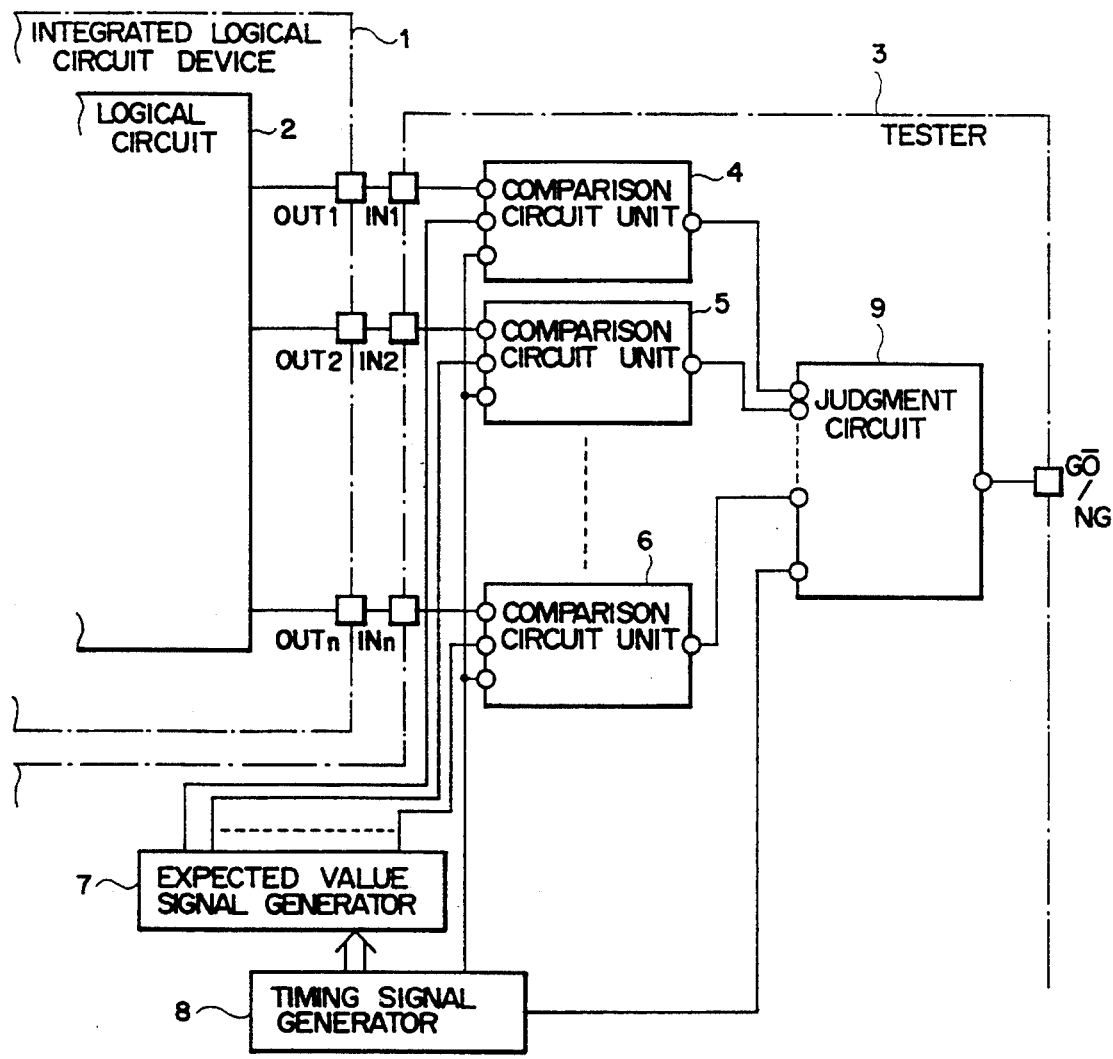
FIG. 5 is a block diagram showing the structure of a conventional tester.

Signal waveforms of the tester are shown in the timing chart of FIG. 4. The initializing signal INIT is first set to level "1" to initialize the counter 37 and D-type flip-flops 48 and 49. The initial values of the logical signal 4D1 can then be checked in the following manner. With the initializing signal INIT being set to "1" level and with the clock terminal CLK being set to "0" level, the selector 38 selects a signal at the output terminal Q1. In this condition, an output of the decoder 36 is set to "0" level to allow the logical signal 4D1 to be outputted from the EX-OR gate 46. With the above settings, it is possible to check the initial values of the logical signal 4D1.

After the initial value check, a test for the logical signals 1D1 to 4D1 can start in the manner as described for the first embodiment, when the fourth clock pulse CLK rises. In this timing chart, similar to FIG. 2, the logical signals 1D14 and 1D18 change at the eighth and twelfth clock pulses CLKs.

Similar to the first embodiment, in the second embodiment, the test results are outputted in real time while selecting one of the output terminals Q1 to Q3 by the selector 38. Instead, the test results may be outputted after completion of all tests for example.

According to the first and second embodiments, information to be stored for comparison with logical signals is only the information about initial values of a logical signal and level change point signals indicating changes in level of logical signals. Unlike a conventional method wherein expected value signals are required to be stored for all levels of logical signals, it is not necessary to provide a memory of large capacity for such a great amount of expected value signals, considerably reducing the size of the tester. It is therefore possible to implement both the tester and logical circuits on a single integrated logical circuit device. Furthermore, in testing a device having a plurality of the same logical circuits such as a memory, it is possible to provide a tester with a necessary test precision and reduced size, by checking whether all logical signals are the same and whether an optional one of logical signals is normal, as in the second embodiment.

What is claimed is:

1. A method of testing a logical signal comprising the steps of:

comparing at least one arbitrary bit of a first logical signal outputted from a logical circuit to be tested with a test signal which assumes an expected value of said arbitrary bit corresponding to a correct level of said first logical signal; and comparing a bit position at which a level of said first logical signal changes with an expected bit position of said test signal representing a bit position at which a level of said first logical signal correctly changes.

2. An apparatus for testing logical signals comprising:

first comparison means for comparing a first logical signal outputted from a logical circuit to be tested with a test signal which assumes an expected value corresponding to a correct level of said first logical signal, during at least one arbitrary unit test cycle;

change point detecting means for detecting a time when said first logical signal changes level and outputting change point information, by comparing said first logical signal delayed by said unit test cycle with said first logical signal that has not been delayed;

expected change point generating means for generating an expected change point signal indicating a bit position at which said level of said test signal changes; and second comparison means for comparing said change point information with said expected change point signal, wherein said logical circuit to be tested is tested using comparison results of said first and second comparison means.

3. An apparatus for testing a single or a plurality of logical circuits which output a plurality of logical signals, comprising:

first comparison means for comparing a first logical signal among said plurality of logical signals with a test signal which assumes an expected value corresponding to a correct level of said first logical signal, during at least one arbitrary unit test cycle;

change point detecting means for detecting a time when said first logical signal changes level and outputting change point information, by comparing said first logical signal delayed by said unit test cycle with said first logical signal that has not been delayed;

expected change point generating means for generating an expected change point signal indicating a bit position at which said level of said first logical signal changes;

second comparison means for comparing said change point information with said expected change point signal; and third comparison means for comparing all of said plurality of logical signals in a same manner as said first logical signal was compared to said test signal, wherein said plurality of logical circuits are tested using comparison results of said first, second, and third comparison means.

4. A method of testing logical signals comprising the steps of:

(a) comparing a plurality of logical signals outputted from a logical circuit to be tested with a plurality of test signals which assume corresponding correct levels of said plurality of logical signals, respectively, during at least one arbitrary unit test cycle;

(b) comparing bit positions at which levels of said plurality of logical signals change with expected bit positions representing bit positions at which said plurality of test signals respectively change;

(c) judging whether or not all results obtained from the comparisons of steps (a) and (b) are correct; and (d) outputting a signal indicating a normal state when all of said results are correct and outputting a signal indicating an abnormal state when any of said results is not correct.

5. A method of testing logical signals comprising the steps of:

(a) comparing a plurality of logical signals outputted from a logical circuit to be tested with a plurality of test signals which assume expected values corresponding to correct levels of said plurality of logical signals, respectively, during at least one arbitrary unit test cycle;

(b) comparing bit positions at which levels of said plurality of logical signals change with expected bit positions representing bit positions at which levels of said plurality of test signals change, respectively;

(c) judging whether or not all results obtained from the comparisons of steps (a) and (b) are correct;

outputting a signal indicating a normal state when all of said results are correct and outputting a signal indicating an abnormal state when any of said results is not correct;

(d) latching said signal indicating a normal state or an abnormal state during all test cycles; and outputting a signal indicating that said logical circuit is in a normal state when all of said latched signals indicate a normal state and outputting a signal indicating that said logical circuit is in an abnormal state when any of said latch signals indicates an abnormal state.

6. An apparatus for testing logical signals comprising:

first comparison means for comparing a plurality of logical signals outputted from a logical circuit to be tested with a plurality of respective test signals which assume expected values corresponding to correct levels of said plurality of logical signals, during at least one arbitrary unit test cycle;

change point detecting means for detecting times when said plurality of logical signals change levels and outputting change point information signals, by comparing, respectively, said plurality of logical signals delayed with said plurality of logical signals which have not been delayed;

expected change point generating means for generating expected change point signals indicating respective bit positions at which levels of said plurality of test signals change;

second comparison means for respectively comparing said change point information signals with said expected change point signals; and judgement means for judging whether or not said logical circuit is in a normal state, by using comparison results obtained by said first and second comparison means.

7. An apparatus according to claim 6, further comprising latching means for latching judgement results obtained by said judgement means, outputting a signal indicating that said logical circuit is in a normal state when all of said latched judgement results indicate a normal state, and outputting a signal indicating that said logical circuit is in an abnormal state when any of said latched judgement results indicate an abnormal state.

* * * * *